(12) United States Patent
Phan

(10) Patent No.: US 10,156,887 B2
(45) Date of Patent: Dec. 18, 2018

(54) CACHE MEMORY CLOCK GENERATION CIRCUITS FOR REDUCING POWER CONSUMPTION AND READ ERRORS IN CACHE MEMORY

(71) Applicant: QUALCOMM Incorporated, San Diego, CA (US)

(72) Inventor: Michael Phan, Cary, NC (US)

(73) Assignee: QUALCOMM Incorporated, San Diego, CA (US)

(*) Notice: Subject to any disclaimer, the term of this patent is extended or adjusted under 35 U.S.C. 154(b) by 38 days.

(21) Appl. No.: 15/280,328

(22) Filed: Sep. 29, 2016

(65) Prior Publication Data

US 2018/0088659 A1 Mar. 29, 2018

(51) Int. Cl.
*G06F 1/32* (2006.01)
*G06F 12/0864* (2016.01)
*G06F 1/08* (2006.01)
*G06F 12/0895* (2016.01)
*G11C 8/18* (2006.01)

(52) U.S. Cl.
CPC .............. *G06F 1/3275* (2013.01); *G06F 1/08* (2013.01); *G06F 1/324* (2013.01); *G06F 12/0864* (2013.01); *G06F 12/0895* (2013.01); *G11C 8/18* (2013.01); *G06F 2212/1028* (2013.01);
(Continued)

(58) Field of Classification Search
CPC ............. G06F 12/0864; G06F 12/0802; G06F 12/0882; G06F 12/0893; G06F 12/0895; G06F 12/0897; G06F 1/3275; G06F 1/08; G06F 1/04; G06F 1/324; G06F 1/3287; G06F 2212/6032; G06F 2212/604; G06F 2212/1028; G06F 2212/6082
See application file for complete search history.

(56) References Cited

U.S. PATENT DOCUMENTS 3,911,227 A * 10/1975 Lawrence .............. H04Q 3/545
    379/232
5,301,193 A * 4/1994 Toyofuku .............. H04J 3/0632
    370/395.4
(Continued)

OTHER PUBLICATIONS

International Search Report and Written Opinion for PCT/US2017/049895, dated Nov. 30, 2017, 12 pages.
(Continued)

*Primary Examiner* — Michael Krofcheck
(74) *Attorney, Agent, or Firm* — Withrow & Terranova, PLLC

(57) ABSTRACT

Cache memory clock generation circuits for reducing power consumption and read errors in cache memory are provided. In one aspect, a cache memory clock generation circuit employs detector circuit configured to receive a way address and generate a one way hit signal indicating if cache read request results in a single way hit. Clock and enable circuit is configured to generate a cache clock signal in response to a system clock signal and a cache enable signal, and generate a cache read enable signal in response to the cache clock signal and a read enable signal. Gating circuit is configured to generate a read clock signal in response to one way hit signal, cache clock signal, and cache read enable signal. Sense amplifier clock generation circuit is configured to generate sense amplifier clock signal in response to the read clock signal having a defined pulse width.

21 Claims, 8 Drawing Sheets

(52) U.S. Cl.
CPC ........... *G06F 2212/6032* (2013.04); *G06F 2212/6082* (2013.01)

(56) References Cited

U.S. PATENT DOCUMENTS

| | | | |
|---|---|---|---|
| 5,715,426 A | 2/1998 | Takahashi et al. | |
| 5,920,888 A | 7/1999 | Shirotori et al. | |
| 5,956,746 A * | 9/1999 | Wang ................ | G06F 12/0864 |
| | | | 711/122 |
| 8,225,046 B2 | 7/2012 | Licht et al. | |
| 8,352,683 B2 | 1/2013 | Cohen et al. | |
| 9,244,823 B2 | 1/2016 | Cho et al. | |
| 9,396,117 B2 | 7/2016 | Aggarwal et al. | |
| 2010/0100684 A1* | 4/2010 | Kurosawa .......... | G06F 12/0864 |
| | | | 711/128 |
| 2010/0265778 A1* | 10/2010 | Yasuda ............... | G11C 7/08 |
| | | | 365/194 |
| 2013/0159757 A1* | 6/2013 | Park .................. | G11C 15/00 |
| | | | 713/400 |
| 2014/0136787 A1* | 5/2014 | Cho .................. | G06F 12/00 |
| | | | 711/128 |
| 2014/0359223 A1 | 12/2014 | Yu et al. | |

OTHER PUBLICATIONS

International Preliminary Report on Patentability for PCT/US2017/049895, dated Aug. 24, 2018, 6 pages.

* cited by examiner

CACHE MEMORY CLOCK GENERATION CIRCUITS FOR REDUCING POWER CONSUMPTION AND READ ERRORS IN CACHE MEMORY

BACKGROUND

I. Field of the Disclosure

The technology of the disclosure relates generally to cache memory, and more particularly to reducing power consumption and read errors in cache memory.

II. Background

A memory cell is a basic building block of computer data storage, which is conventionally referred to as "memory." A processor-based system can employ multiple types of memory, such as main memory and cache memory, for example. Main memory is conventionally a larger memory disposed on a chip that is separate from the chip on which a processor is located. Due to the larger size and separate location from the processor, main memory conventionally has a longer access latency. Cache memory is a smaller, faster memory conventionally disposed on the same chip as the processor so as to achieve a shorter access latency. In particular, cache memory can be configured to store copies of data corresponding to frequently accessed memory addresses in main memory or higher level cache memory. In this manner, data stored at frequently accessed memory addresses can be retrieved in a shorter amount of time, thus increasing performance of the processor-based system.

One type of cache memory is an N-way set associative cache memory configured to store data in an N number of separate partitions referred to as "ways." In particular, an N-way set-associative cache memory employs N data arrays configured to store data and N tag arrays configured to store tags associated with corresponding data stored in the N data arrays. In response to a cache read request, the tag of the requested data is provided to each tag array. The tag of the requested data is compared to a tag stored in each tag array. If the tag of the requested data matches a tag stored in one of the N tag arrays, a hit is generated, and the requested data is read from the data array corresponding to the tag array associated with the hit. On the other hand, if the tag of the requested data does not match a tag stored in one of the N tag arrays, a miss is generated, resulting in no data being read.

Problems can arise from the conventional operation of the N-way set associative cache memory described above. For example, portions of an N-way set associative cache memory can be disabled in response to cache misses so as to reduce power consumption. However, logic associated with reading the N-way set associative cache memory may not be able to disable components within the N-way set associative cache memory at a frequency in accordance with processor frequency requirements. In this manner, conventional processor-based systems resort to reducing the processor frequency to meet the timing limitations of such logic. Additionally, due to soft error read events (e.g., events due to alpha particles), bits stored in the tag arrays can be flipped. Such bit flips can cause erroneous tag comparisons, which result in either false hits/misses or hits in multiple ways of the N-ways for one read operation, each of which produces read errors. In this manner, it would be advantageous to reduce power in an N-way set associative cache memory while avoiding frequency reductions attributable to disabling cache read logic and reducing read errors caused by bit flips in the tag.

SUMMARY OF THE DISCLOSURE

Aspects disclosed herein include cache memory clock generation circuits for reducing power consumption and read errors in cache memory. In one aspect, a cache memory clock generation circuit employs a detector circuit configured to receive a way address that includes a bit for each corresponding way in a cache memory. The detector circuit is configured to generate a one way hit signal that indicates whether a cache read request results in a tag of the requested read data is found in a single way of the N-ways (e.g., a hit). This is opposed to the tag not being found in any of the N-ways (e.g., a miss), or the tag being in more than one (1) of the N-ways (e.g., a multiple way hit). The cache memory clock generation circuit also includes a clock and enable circuit configured to generate a cache clock signal in response to a system clock signal and a cache enable signal each being in an active state. The clock and enable circuit is also configured to generate a cache read enable signal in response to the cache clock signal and a read enable signal each being in an active state. A gating circuit is configured to generate a read clock signal in response to the one way hit signal, the cache clock signal, and the cache read enable signal each being in an active state. In other words, the read clock signal is generated if the tag of the cache read request is found in a single way of the N ways while the cache memory is enabled and clocked. Further, a sense amplifier clock generation circuit is configured to generate a sense amplifier clock signal in response to the read clock signal having a defined pulse width.

In this manner, a sense amplifier configured to sense the requested read data from the cache memory is clocked in response to a hit in a single way, but not in response to a miss or an erroneous multiple way hit. Further, logic used to disable the N-way set associative cache memory during miss or multiple hit scenarios is avoided. Such additional logic conventionally cannot operate at a frequency in accordance with processor frequency requirements. Thus, the processor frequency is not reduced to meet the timing limitations of the disabling logic. Therefore, clock gating the sense amplifier in this manner reduces power consumption while improving performance by disabling sensing during misses and multiple hits without reducing processor frequency, and reduces read errors by not attempting to erroneously sense read data from multiple ways in the cache memory.

In this regard in one aspect, a cache memory clock generation circuit is provided. The cache memory clock generation circuit comprises a detector circuit. The detector circuit is configured to receive a way address comprising a plurality of bits, wherein each bit of the plurality of bits corresponds to a way of a plurality of ways in a cache memory and indicates if a tag of a cache read request is present in the corresponding way. The detector circuit is also configured to generate a one way hit signal in an active state in response to one bit of the plurality of bits of the way address being in an active state. The cache memory clock generation circuit also comprises a clock and enable circuit. The clock and enable circuit is configured to receive a system clock signal, a cache enable signal, and a read enable signal. The clock and enable circuit is also configured to generate a cache clock signal in response to the system clock signal and the cache enable signal each being in an active state. The clock and enable circuit is also configured to generate a cache read enable signal in an active state in response to the cache clock signal and the read enable signal each being in an active state. The cache memory clock generation circuit also comprises a gating circuit configured to generate a read clock signal in response to the one way hit signal, the cache clock signal, and the cache read enable signal each being in an active state. The cache memory clock generation circuit also comprises a sense amplifier clock generation circuit configured to generate a sense amplifier clock signal in response to the read clock signal having a defined pulse width.

In another aspect, a cache memory clock generation circuit is provided. The cache memory clock generation circuit comprises a means for receiving a way address comprising a plurality of bits, wherein each bit of the plurality of bits corresponds to a way of a plurality of ways in a cache memory and indicates if a tag of a cache read request is present in the corresponding way. The cache memory clock generation circuit also comprises a means for generating a one way hit signal in an active state in response to one bit of the plurality of bits of the way address being in an active state. The cache memory clock generation circuit also comprises a means for receiving a system clock signal, a cache enable signal, and a read enable signal. The cache memory clock generation circuit also comprises a means for generating a cache clock signal in response to the system clock signal and the cache enable signal each being in an active state. The cache memory clock generation circuit also comprises a means for generating a cache read enable signal in an active state in response to the cache clock signal and the read enable signal each being in an active state. The cache memory clock generation circuit also comprises a means for generating a read clock signal in response to the one way hit signal, the cache clock signal, and the cache read enable signal each being in an active state. The cache memory clock generation circuit also comprises a means for generating a sense amplifier clock signal in response to the read clock signal having a defined pulse width.

In another aspect, a method for clocking a cache memory to reduce power consumption and read errors is provided. The method comprises receiving a way address comprising a plurality of bits, wherein each bit of the plurality of bits corresponds to a way of a plurality of ways in a cache memory and indicates if a tag of a cache read request is present in the corresponding way. The method also comprises generating a one way hit signal in an active state in response to one bit of the plurality of bits of the way address being in an active state. The method also comprises receiving a system clock signal, a cache enable signal, and a read enable signal. The method also comprises generating a cache clock signal in response to the system clock signal and the cache enable signal each being in an active state. The method also comprises generating a cache read enable signal in an active state in response to the cache clock signal and the read enable signal each being in an active state. The method also comprises generating a read clock signal in response to the one way hit signal, the cache clock signal, and the cache read enable signal each being in an active state. The method also comprises generating a sense amplifier clock signal in response to the read clock signal having a defined pulse width.

In another aspect, an N-way set associative cache memory system is provided. The N-way set associative cache memory system comprises a plurality of memory banks. Each memory bank of the plurality of memory banks comprises a plurality of data arrays, wherein each data array of the plurality of data arrays corresponds to a way of a plurality of ways. Each memory bank of the plurality of memory banks also comprises a plurality of tag comparators, wherein each tag comparator of the plurality of tag comparators corresponds to a way of the plurality of ways. Each memory bank of the plurality of memory banks also comprises a sense amplifier configured to read data from a corresponding data array of the plurality of data arrays in response to a sense amplifier clock signal. The N-way set associative cache memory system also comprises a plurality of cache memory clock generation circuits. Each cache memory clock generation circuit corresponds to a memory bank of the plurality of memory banks. Each cache memory clock generation circuit comprises a detector circuit. The detector circuit is configured to receive a way address comprising a plurality of bits, wherein each bit of the plurality of bits corresponds to a way of the plurality of ways and indicates if a tag of a cache read request is present in the corresponding way. The detector circuit is also configured to generate a one way hit signal in an active state in response to one bit of the plurality of bits of the way address being in an active state. Each cache memory clock generation circuit also comprises a clock and enable circuit. The clock and enable circuit is configured to receive a system clock signal, a cache enable signal, and a read enable signal. The clock and enable circuit is also configured to generate a cache clock signal in response to the system clock signal and the cache enable signal each being in an active state. The clock and enable circuit is also configured to generate a cache read enable signal in an active state in response to the cache clock signal and the read enable signal each being in an active state. Each cache memory clock generation circuit also comprises a gating circuit. The gating circuit is configured to generate a read clock signal in response to the one way hit signal, the cache clock signal, and the cache read enable signal each being in an active state. Each cache memory clock generation circuit also comprises a sense amplifier clock generation circuit. The sense amplifier clock generation circuit is configured to generate the sense amplifier clock signal in response to the read clock signal having a defined pulse width. The N-way set associative cache memory system also comprises a plurality of output latches. The plurality of output latches is configured to store the data sensed by the sense amplifier corresponding to each of the plurality of memory banks in response to the sense amplifier clock signal.

DETAILED DESCRIPTION

Figure 1:
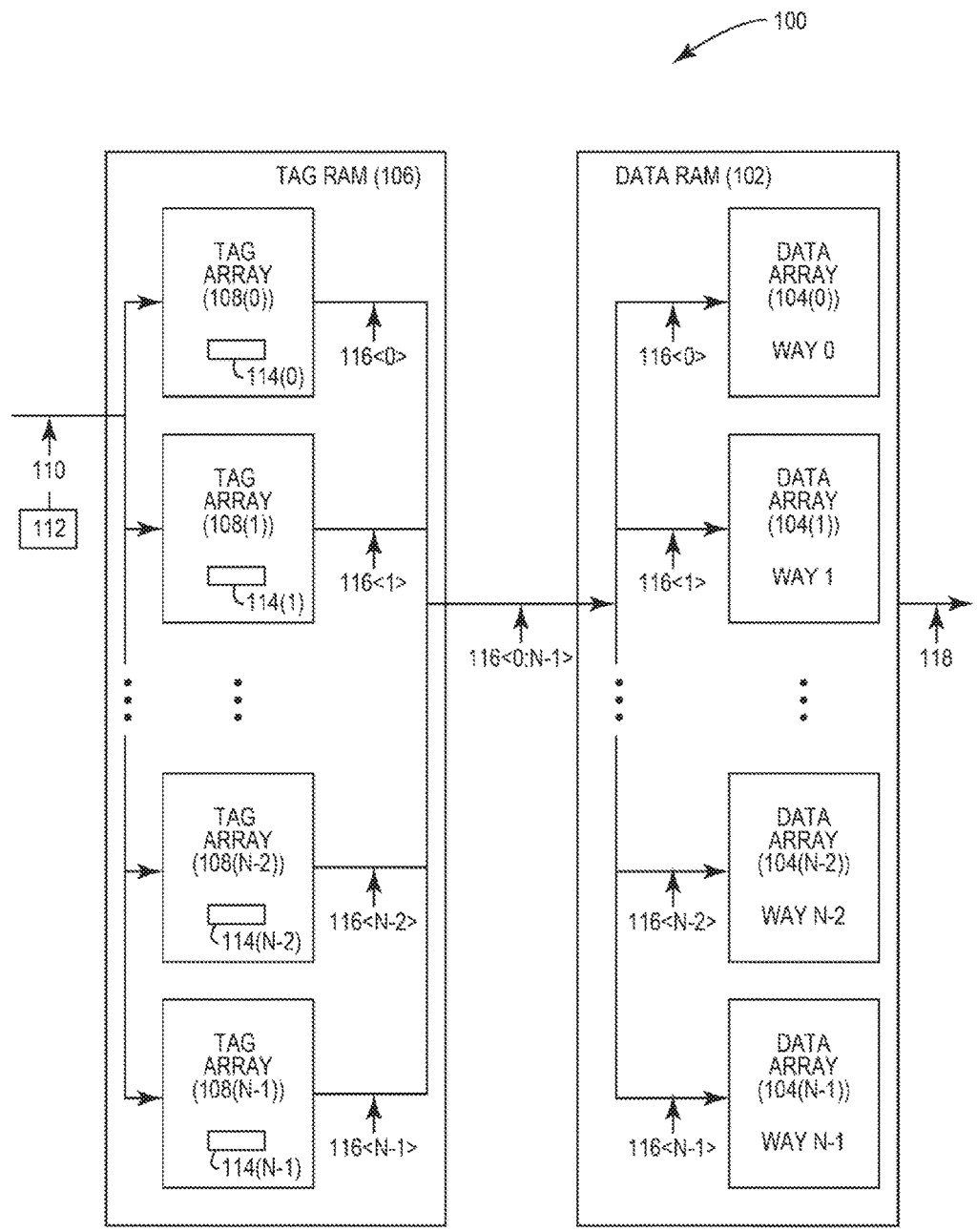
FIG. 1 is a diagram of a conventional N-way set associative cache memory.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
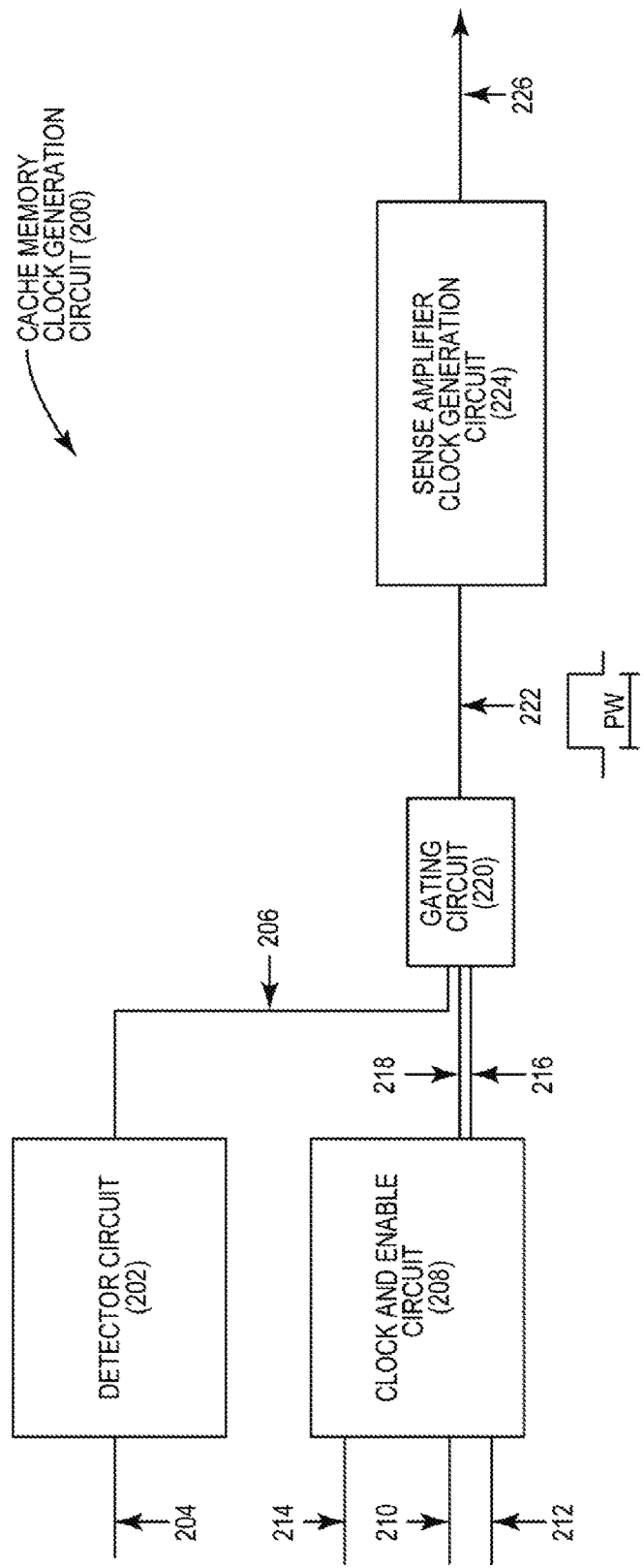
FIG. 2 is a diagram of an exemplary cache memory clock generation circuit configured to clock an N-way set associative cache memory to reduce power consumption without reducing processor frequency while also reducing read errors.

Before discussing the details of cache memory clock generation circuits for reducing power consumption and read errors in cache memory beginning in FIG. 2, the operation of a conventional N-way set associative cache memory is first discussed. In this regard, FIG. 1 illustrates an exemplary N-way set associative cache memory 100. The N-way set associative cache memory 100 employs a data random access memory (RAM) 102 that includes an N number of data arrays 104(0)-104(N−1) configured to store data. Each of the data arrays 104(0)-104(N−1) corresponds to one of N ways (e.g., WAY(0)-WAY(N−1)). The N-way set associative cache memory 100 also employs a tag RAM 106 that includes an N number of tag arrays 108(0)-108(N−1) configured to store tags associated with the corresponding data stored in the corresponding data array 104(0)-104(N−1).

With continuing reference to FIG. 1, a tag 110 corresponding to a cache read request 112 is provided to each tag array 108(0)-108(N−1). A corresponding tag comparator 114(0)-114(N−1) employed in each tag array 108(0)-108(N−1) is configured to compare the tag 110 with the tags stored in the corresponding tag array 108(0)-108(N−1). In this manner, each tag comparator 114(0)-114(N−1) is configured to provide a corresponding bit of a way address 116<0:N−1> being in an active state if the tag 110 matches a tag stored in the corresponding tag array 108(0)-108(N−1) (e.g., a hit). Conversely, each tag comparator 114(0)-114(N−1) is configured to provide the corresponding bit of the way address 116<0:N−1> being in an inactive state if the tag 110 does not match a tag stored in the corresponding tag array 108(0)-108(N−1) (e.g., a miss). Each bit of the way address 116<0:N−1> is provided to the corresponding data array 104(0)-104(N−1) in the data RAM 102. In this manner, each data array 104(0)-104(N−1) is configured to provide the corresponding data as output data 118 in response to the corresponding bit of the way address 116<0:N−1> being in an active state. In other words, the data is read from the data array 104(0)-104(N−1) corresponding to the tag array 108(0)-108(N−1) that generates a hit. However, if the tag 110 does not match a tag stored in one of the tag arrays 108(0)-108(N−1), a miss is generated, resulting in no data being provided as the output data 118.

With continuing reference to FIG. 1, problems can arise from the conventional operation of the N-way set associative cache memory 100. For example, portions of the N-way set associative cache memory 100 can be disabled in response to cache misses so as to reduce power consumption. However, logic (not shown) associated with reading the N-way set associative cache memory 100 may not be able to disable components within the N-way set associative cache memory 100 in response to a miss at a frequency in accordance with processor frequency requirements. In this manner, conventional processor-based systems may resort to reducing the processor frequency to meet the timing limitations of such logic, thus limiting the speed of operation. Additionally, due to soft error read events (e.g., events due to alpha particles), bits stored in the tag arrays 108(0)-108(N−1) can be unintentionally flipped. Such bit flips can cause erroneous tag comparisons, which result in either false hits/misses or hits in multiple ways of the N-ways for one cache read request 112, each of which produces read errors.

In this regard, FIG. 2 illustrates an exemplary cache memory clock generation circuit 200 for improving performance and reducing read errors in a cache memory, such as the N-way set associative cache memory 100 of FIG. 1. The cache memory clock generation circuit 200 employs a detector circuit 202 configured to receive a way address 204. In this example, the way address 204 includes N bits that each correspond to one (1) of N ways in a cache memory (not shown). More specifically, each bit of the way address 204 indicates if a tag of a cache read request is present in the corresponding way of an N-way set associative cache memory. The detector circuit 202 is configured to generate a one way hit signal 206 in an active state in response to one (1) bit of the way address 204 being in an active state (e.g., a single bit of the way address 204 being in an active state). In this manner, the one way hit signal 206 indicates whether a tag of a cache read request is found in one (1) way of the N ways (e.g., a hit in only a single way of the N ways). This is opposed to the tag not being found in any of the N ways (e.g., a miss) or the tag being in more than one (1) of the N ways (e.g., a multiple way hit).

With continuing reference to FIG. 2, the cache memory clock generation circuit 200 also includes a clock and enable circuit 208 configured to receive a system clock signal 210, a cache enable signal 212, and a read enable signal 214. In this example, the system clock signal 210 is a top level clock of a corresponding processor-based system (not shown) employing the cache memory clock generation circuit 200. Additionally, the cache enable signal 212 enables operation of the corresponding N-way set associative cache memory (not shown), and the read enable signal 214 enables initiation of a cache read request of the N-way set associative cache memory. The clock and enable circuit 208 is configured to generate a cache clock signal 216 in response to the system clock signal 210 and the cache enable signal 212 both being in an active state. Further, the clock and enable circuit 208 is configured to generate a cache read enable signal 218 in an active state in response to the cache clock signal 216 and the read enable signal 214 both being in an active state. A gating circuit 220 is also included that is configured to generate a read clock signal 222 in response to the one way hit signal 206, the cache clock signal 216, and the cache read enable signal 218 each being in an active state. In other words, the read clock signal 222 is generated if the tag of the cache read request is found in a single way of the N ways while the N-way set associative cache memory is enabled and clocked.

With continuing reference to FIG. 2, the cache memory clock generation circuit 200 also employs a sense amplifier clock generation circuit 224 configured to generate a sense amplifier clock signal 226 in response to the read clock signal 222 having a defined pulse width PW. As described in more detail below, the defined pulse width PW is set to a duration such that the read clock signal 222 triggers the sense amplifier clock signal 226 in response to a true single way hit, as opposed to a glitch. In this manner, the sense amplifier clock signal 226 clocks a sense amplifier (not shown) configured to sense the requested read data from the N-way set associative cache memory in response to a hit in a single way, but not in response to a miss or an erroneous multiple way hit so as to reduce power consumption of the N-way set associative cache memory. Employing the sense amplifier clock signal 226 to prevent completion of a cache read request in this manner avoids employing additional logic to disable the N-way set associative cache memory during miss or multiple hit scenarios. In this manner, because such logic conventionally cannot operate at a frequency in accordance with processor frequency requirements, the absence of the logic avoids the need to reduce the processor frequency to meet the timing limitations of the logic. Thus, clock gating the sense amplifier in this manner reduces power consumption while improving performance by disabling sensing during misses and multiple hits without reducing processor frequency, and reduces read errors by not attempting to erroneously sense read data from multiple ways in the cache memory.

Figure 3:
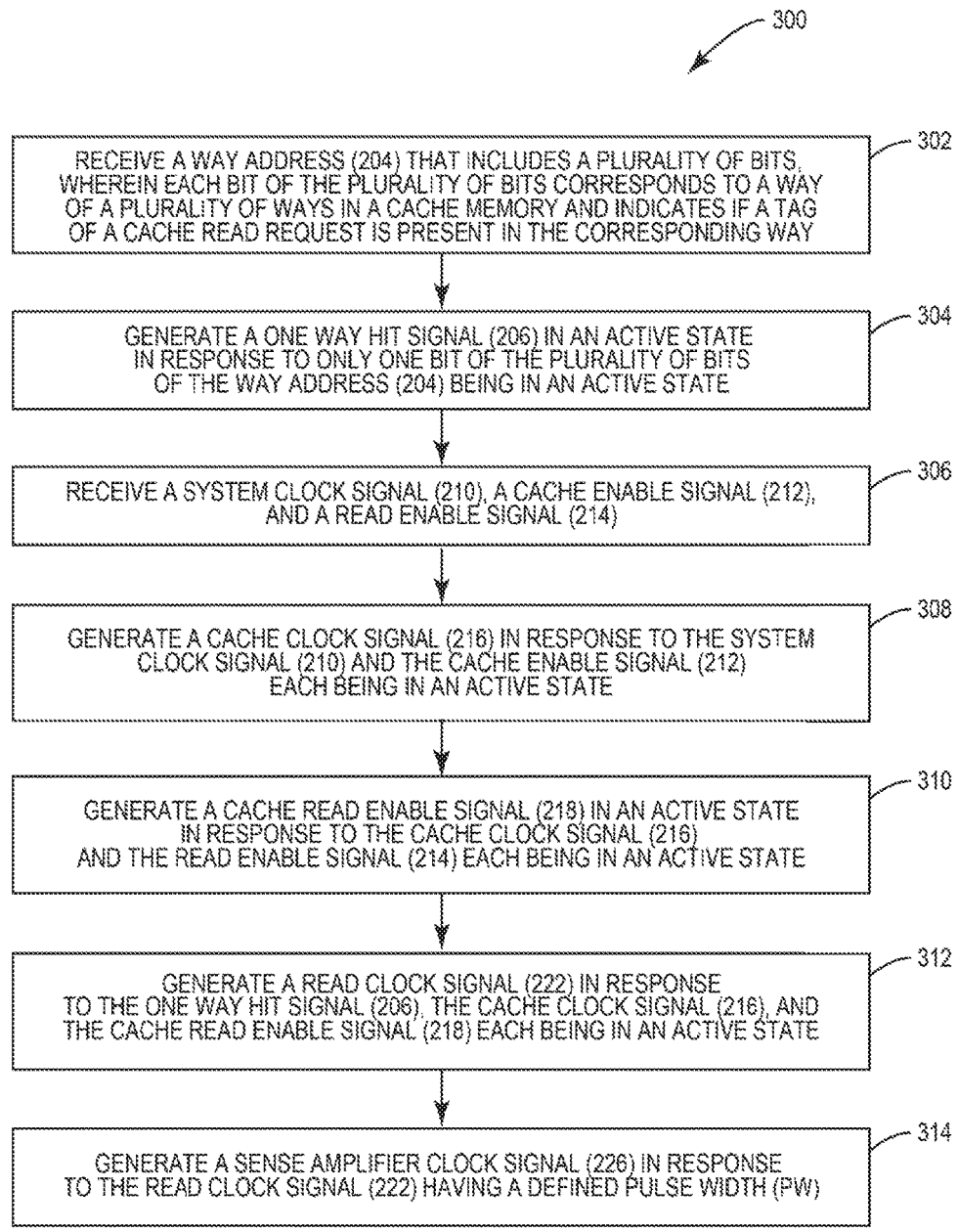
FIG. 3 is a flowchart illustrating an exemplary process employed by the cache memory clock generation circuit of FIG. 2 to clock an N-way set associative cache memory.

In this regard, FIG. 3 illustrates an exemplary process 300 employed by the cache memory clock generation circuit 200 of FIG. 2 to clock an N-way set associative cache memory. The process 300 includes the detector circuit 202 receiving the way address 204 that includes multiple bits, wherein each bit corresponds to a way in a cache memory and indicates if a tag of a cache read request is present in the corresponding way (block 302). The process 300 also includes the detector circuit 202 generating the one way hit signal 206 in an active state in response to one (1) bit of the way address 204 being in an active state (block 304). The process 300 further includes the clock and enable circuit 208 receiving the system clock signal 210, the cache enable signal 212, and the read enable signal 214 (block 306). The process 300 also includes the clock and enable circuit 208 generating the cache clock signal 216 in response to the system clock signal 210 and the cache enable signal 212 both being in an active state (block 308). Additionally, the process 300 includes the clock and enable circuit 208 generating the cache read enable signal 218 in an active state in response to the cache clock signal 216 and the read enable signal 214 both being in an active state (block 310). The process 300 also includes the gating circuit 220 generating the read clock signal 222 in response to the one way hit signal 206, the cache clock signal 216, and the cache read enable signal 218 each being in an active state (block 312). The process 300 also includes the sense amplifier clock generation circuit 224 generating the sense amplifier clock signal 226 in response to the read clock signal 222 having a defined pulse width PW (block 314).

Figure 4:
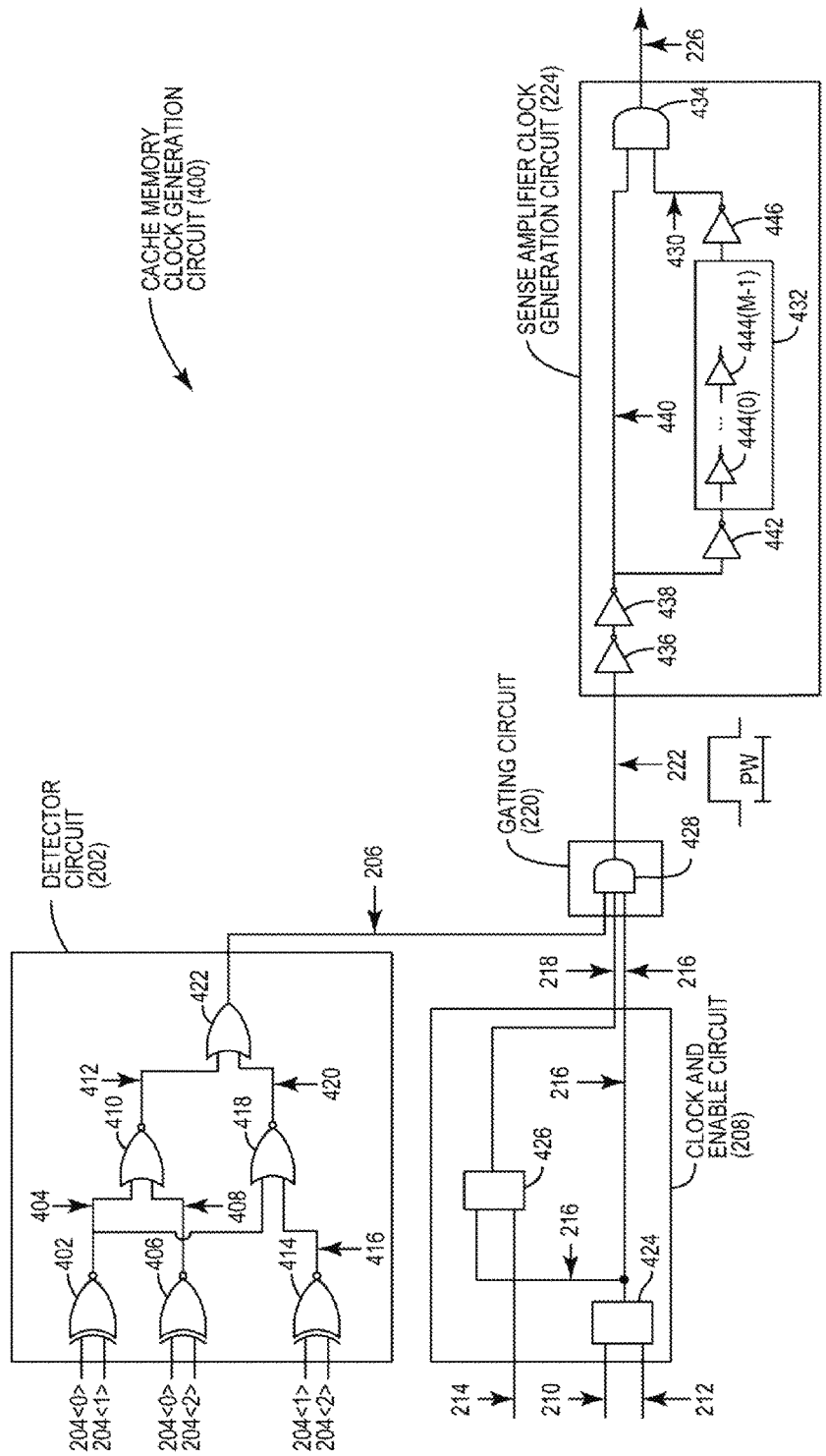
FIG. 4 is a diagram of an exemplary cache memory clock generation circuit configured to clock an N-way set associative cache memory to reduce power consumption and read errors.

Aspects of the cache memory clock generation circuit described herein, such as the cache memory clock generation circuit 200 of FIG. 2, can be implemented using various circuit designs and elements. As a non-limiting example, FIG. 4 illustrates an exemplary cache memory clock generation circuit 400. The cache memory clock generation circuit 400 includes certain common components with the cache memory clock generation circuit 200 of FIG. 2 as shown by common element numbers between FIGS. 2 and 4, and thus will not be re-described herein.

With reference to FIG. 4, the detector circuit 202 is configured to generate the one way hit signal 206 in an active state if one (1) bit of the way address 204 is in an active state. Additionally, the detector circuit 202 is configured to generate the one way hit signal 206 in an inactive state if the way address 204 indicates either a miss in all of the ways, or a hit in more than one way. In particular, the detector circuit 202 is configured to generate the one way hit signal 206 in an inactive state in response to all of the bits of the way address 204 being in an inactive state. In other words, the detector circuit 202 generates the one way hit signal 206 being in an inactive state in response to a miss. Additionally, the detector circuit 202 is configured to generate the one way hit signal 206 in an inactive state in response to more than one (1) bit of the way address 204 being in an active state. In other words, the detector circuit 202 generates the one way hit signal 206 in an inactive state in response to a hit in multiple ways.

With continuing reference to FIG. 4, to achieve the above described functionality, the detector circuit 202 in this aspect employs XOR-OR cone logic. In particular, the detector circuit 202 in this example is configured for a three (3)-way set associative cache memory (not shown). In this manner, the way address 204 includes three (3) bits <0:2>, the detector circuit 202 employs an XOR-based logic gate 402 (e.g., XNOR gate 402) configured to receive bit zero (0) and bit one (1) of the way address 204, and provide an XOR-based output signal 404. The detector circuit 202 also employs an XOR-based logic gate 406 (e.g., XNOR gate 406) configured to receive bit zero (0) and bit two (2) of the way address 204, and provide an XOR-based output signal 408. Further, the XOR-based output signals 404, 408 are provided to an OR-based gate 410 (e.g., NOR gate 410) configured to provide an OR-based output signal 412. The detector circuit 202 employs an XOR-based logic gate 414 (e.g., XNOR gate 414) configured to receive bit one (1) and bit two (2) of the way address 204, and provide an XOR-based output signal 416. The detector circuit 202 also employs an OR-based logic gate 418 (e.g., NOR gate 418) configured to receive the XOR-based output signals 404, 416, and provide an OR-based output signal 420. The OR-based output signals 412, 420 are provided to an OR-based gate 422 (e.g., OR gate 422) that is configured to generate the one way hit signal 206. While this aspect illustrates the XOR-OR cone logic for the detector circuit 202 for a three (3)-way set associative cache memory, the detector circuit 202 can be configured in other aspects to support any N number of ways by employing an XOR-OR cone logic with corresponding logic gates.

With continuing reference to FIG. 4, the clock and enable circuit 208 is configured to generate the cache clock signal 216 and the cache read enable signal 218 by employing a clock generation circuit 424 and a flip-flop 426, respectively. In particular, the clock generation circuit 424 is configured to receive the system clock signal 210 and the cache enable signal 212. The clock generation circuit 424 is further configured to provide the cache clock signal 216 in an active state in response to the system clock signal 210 and the cache enable signal 212 being in an active state. Additionally, the flip-flop 426 is configured to receive the read enable signal 214 and the cache clock signal 216. The flip-flop 426 is also configured to provide the cache read enable signal 218 in an active state in response to the read enable signal 214 and the cache clock signal 216 being in an active state.

With continuing reference to FIG. 4, the gating circuit 220 is configured to generate the read clock signal 222 by employing an AND-based logic gate 428 (e.g., AND gate 428). In particular, the AND-based logic gate 428 is configured to receive the one way hit signal 206, the cache clock signal 216, and the cache read enable signal 218. The AND-based logic gate 428 is configured to provide the read clock signal 222 in an active state in response to the one way hit signal 206, the cache clock signal 216, and the cache read enable signal 218 each being in an active state. In other words, as previously described, the read clock signal 222 is generated if the tag of the cache read request is found in one (1) of the N ways while the N-way set associative cache memory is enabled and clocked.

With continuing reference to FIG. 4, the sense amplifier clock generation circuit 224 is configured to generate the sense amplifier clock signal 226 by being configured to receive the read clock signal 222 and generate a delayed read clock signal 430 that is representative of the read clock signal 222 delayed by a defined time period. The sense amplifier clock generation circuit 224 is further configured to generate the sense amplifier clock signal 226 in response to the read clock signal 222 and the delayed read clock signal 430 being in an active state. As a non-limiting example, to achieve the above described functionality, the sense amplifier clock generation circuit 224 employs a delay circuit 432 and an AND-based logic gate 434 (e.g., AND gate 434).

In particular, with continuing reference to FIG. 4, the read clock signal 222 is received by inverters 436, 438 employed to buffer an input load of the sense amplifier clock generation circuit 224. A buffered read clock signal 440 is provided from the inverter 438 to the AND-based logic gate 434, and to an inverter 442 employed to buffer an input load of the delay circuit 432. In this manner, the inverter 442 provides an inverted version of the buffered read clock signal 440 to the delay circuit 432, which employs an even number M of serially coupled inverters 444(0)-444(M−1). In this example, the number M of inverters 444(0)-444(M−1) is based in part on the timing of the sense amplifier (not shown) being clocked by the sense amplifier clock signal 226. More specifically, the number M of inverters 444(0)-444(M−1) is set such that the delay circuit 432 provides enough delay to account for process variations that may increase the sensing time of the sense amplifier. A first inverter 444(0) is configured to receive the inverted version of the buffered read clock signal 440, while a final inverter 444(M−1) is configured to provide an inverted version of the delayed read clock signal 430. An inverter 446 employed to buffer an output load of the delay circuit 432 receives the inverted version of the delayed read clock signal 430, and provides the delayed read clock signal 430 to the AND-based logic gate 434. In this manner, the AND-based logic gate 434 provides the sense amplifier clock signal 226 in an active state in response to both the buffered read clock signal 440 and the delayed read clock signal 430 being in an active state. In other aspects, the inverters 436, 438, 442, and 446 may not be employed such that the AND-based logic gate 434 and the first inverter 444(0) can be configured to receive the read clock signal 222, and the final inverter 444(M−1) can be configured to provide the delayed read clock signal 430.

Figure 5:
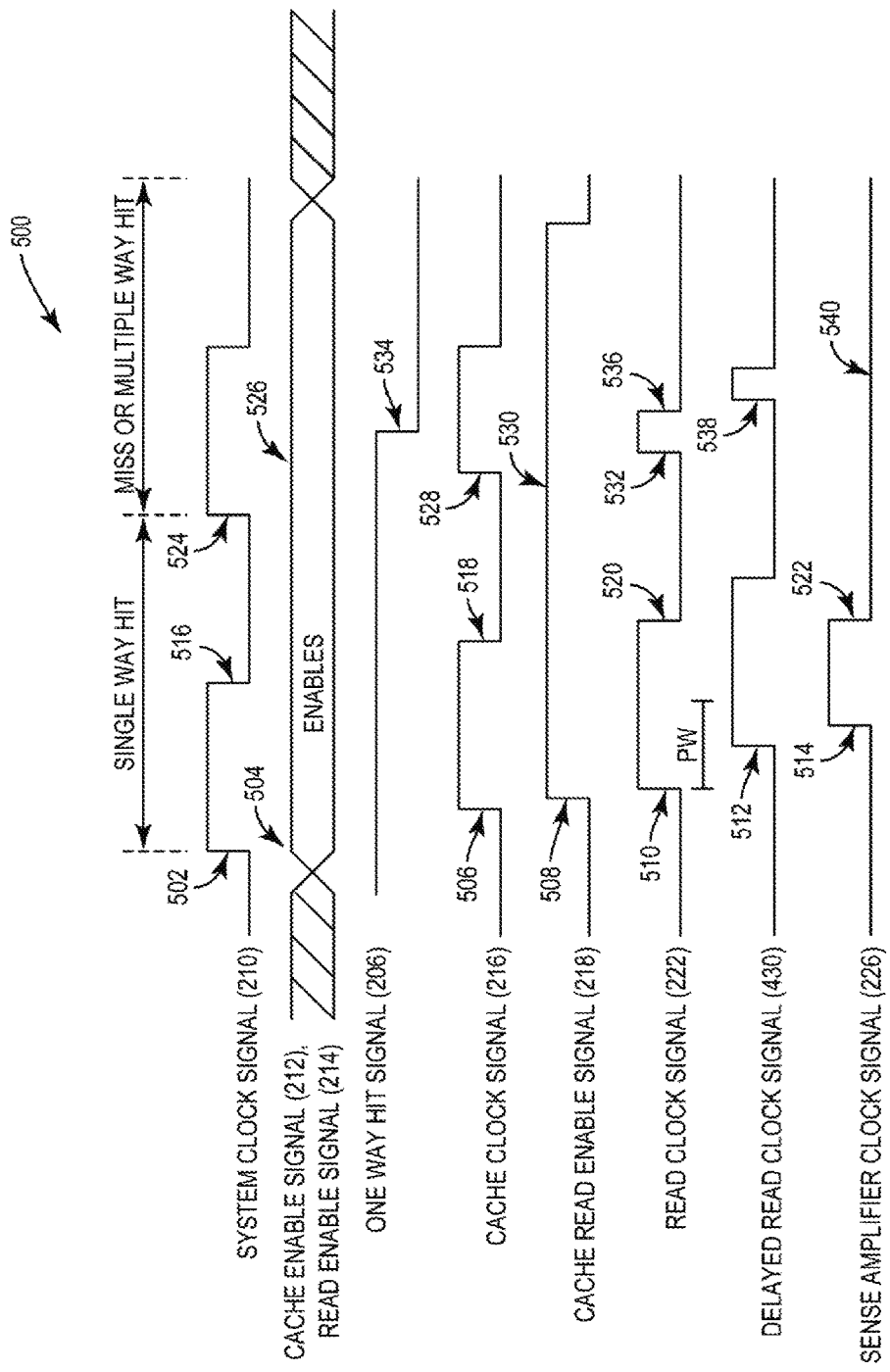
FIG. 5 is a timing diagram of exemplary signals generated by the cache memory clock generation circuit of FIG. 4.

FIG. 5 illustrates a timing diagram 500 of exemplary signals generated by the cache memory clock generation circuit 400 of FIG. 4. In this example, an active state is defined as a logic "1," and an inactive state is defined as a logic "0." However, other aspects may achieve similar functionality if employing an active state of logic "0" and an inactive state of logic "1."

With continuing reference to FIG. 5, an example of a single way hit is first described. In this regard, the system clock signal 210 transitions to an active state (arrow 502) while the cache enable signal 212 and the read enable signal 214 both have an active state (arrow 504). In response to the system clock signal 210 and the cache enable signal 212 being in an active state, the cache clock signal 216 transitions to an active state (arrow 506). Further, in response to the read enable signal 214 and the cache clock signal 216 both being in an active state, the cache read enable signal 218 also transitions to an active state (arrow 508). In response to the one way hit signal 206, the cache clock signal 216, and the cache read enable signal 218 being in an active state, the read clock signal 222 transitions to an active state (arrow 510). The active state of the read clock signal 222 in turn causes the delayed read clock signal 430 to transition to an active state (arrow 512). Further, the read clock signal 222 remains in an active state for the defined pulse width PW such that the sense amplifier clock signal 226 transitions to an active state (arrow 514). In this manner, the sense amplifier clock signal 226 is in an active state so as to clock the sense amplifier in response to a single way hit in the N-way set associative cache memory. Further, the system clock signal 210 transitions to an inactive state (arrow 516), which causes the cache clock signal 216 to transition to an inactive state (arrow 518). As a result, the read clock signal 222 (arrow 520), and thus, the sense amplifier clock signal 226 (arrow 522) transition to an inactive state.

With continuing reference to FIG. 5, an example of a miss or a multiple way hit is now described. In this manner, the system clock signal 210 transitions to an active state (arrow 524) while the cache enable signal 212 and the read enable signal 214 are both in an active state (arrow 526). In response to the system clock signal 210 and the cache enable signal 212 being in an active state, the cache clock signal 216 transitions to an active state (arrow 528). Further, the cache read enable signal 218 remains in an active state (arrow 530). In response to the one way hit signal 206, the cache clock signal 216, and the cache read enable signal 218 being in an active state, the read clock signal 222 transitions to an active state (arrow 532). Unlike during the single way hit example above, the one way hit signal 206 transitions to an inactive state (arrow 534) due to either a miss or a multiple way hit, which causes the read clock signal 222 to transition to an inactive state (arrow 536). Further, the delayed read clock signal 430 transitions to an active state (arrow 538) in response to the read clock signal 222 briefly being in an active state.

However, with continuing reference to FIG. 5, because the read clock signal 222 previously transitioned to an inactive state at arrow 536, the sense amplifier clock signal 226 remains in an inactive state (arrow 540). Thus, although the read clock signal 222 briefly is in an active state starting at arrow 532, the sense amplifier clock signal 226 does not transition to an active state due to the timing of the detector circuit 202 and the delay of the delay circuit 432. In particular, the detector circuit 202 is configured to transition the one way hit signal 206 to an inactive state at arrow 534 in response to a miss or multiple way hit with timing configured to cause the read clock signal 222 to transition to an inactive state at arrow 536 prior to the delayed read clock signal 430 transitioning to an active state at arrow 538. Further, the delay corresponding to the delay circuit 432 is designed such that the read clock signal 222 triggers the sense amplifier clock signal 226 if the read clock signal 222 is in an active state for the defined pulse width PW. In this manner, the sense amplifier clock signal 226 is only triggered in response to a true single way hit, and not triggered in response to a miss, a multiple way hit, or a glitch on the way address 204.

Figure 6:
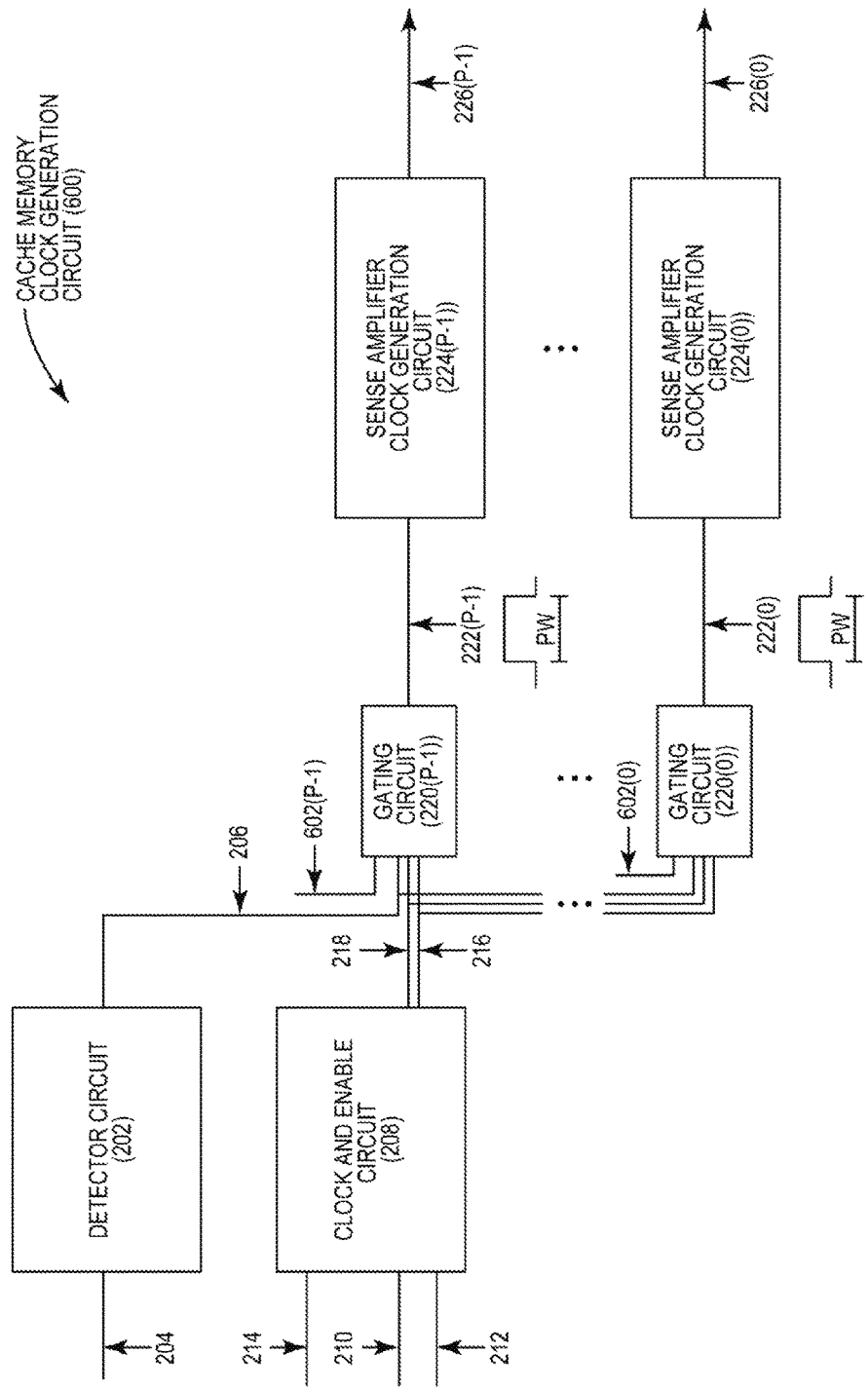
FIG. 6 is a diagram of an exemplary cache memory clock generation circuit configured to clock a multiple bank N-way set associative cache memory.

While the cache memory clock generation circuits 200 and 400 of FIGS. 2 and 4 are configured to clock an N-way set associative cache memory employing one (1) memory bank, the cache memory clock generation circuits in the aspects described herein can also be configured for an N-way set associative cache memory employing multiple memory banks. In this regard, FIG. 6 illustrates an exemplary cache memory clock generation circuit 600 configured to clock an N-way set associative cache memory (not shown) employing a P number of memory banks (not shown). The cache memory clock generation circuit 600 includes certain common components with the cache memory clock generation circuit 200 of FIG. 2 as shown by common element numbers between FIGS. 2 and 6, and thus will not be re-described herein.

With continuing reference to FIG. 6, the cache memory clock generation circuit 600 employs the detector circuit 202 and the clock and enable circuit 208. However, rather than employing a single gating circuit 220, the cache memory clock generation circuit 600 employs a gating circuit 220(0)-220(P−1) for each of the P number of memory banks employed in the N-way set associative cache memory. Each of the gating circuits 220(0)-220(P−1) also receives a corresponding bank enable signal 602(0)-602(P−1) that indicates which memory bank is to be clocked. In this manner, the gating circuits 220(0)-220(P−1) generate the corresponding read clock signal 222(0)-222(P−1) in an active state in response to the one way hit signal 206, the cache clock signal 216, and the cache read enable signal 218 each being in an active state. Further, each read clock signal 222(0)-222(P−1) is provided to a corresponding sense amplifier clock generation circuit 224(0)-224(P−1). In this manner, each of the sense amplifier clock generation circuits 224(0)-224(P−1) is configured to generate a corresponding sense amplifier clock signal 226(0)-226(P−1) that clocks the sense amplifier (not shown) of the corresponding memory bank.

Figure 7:
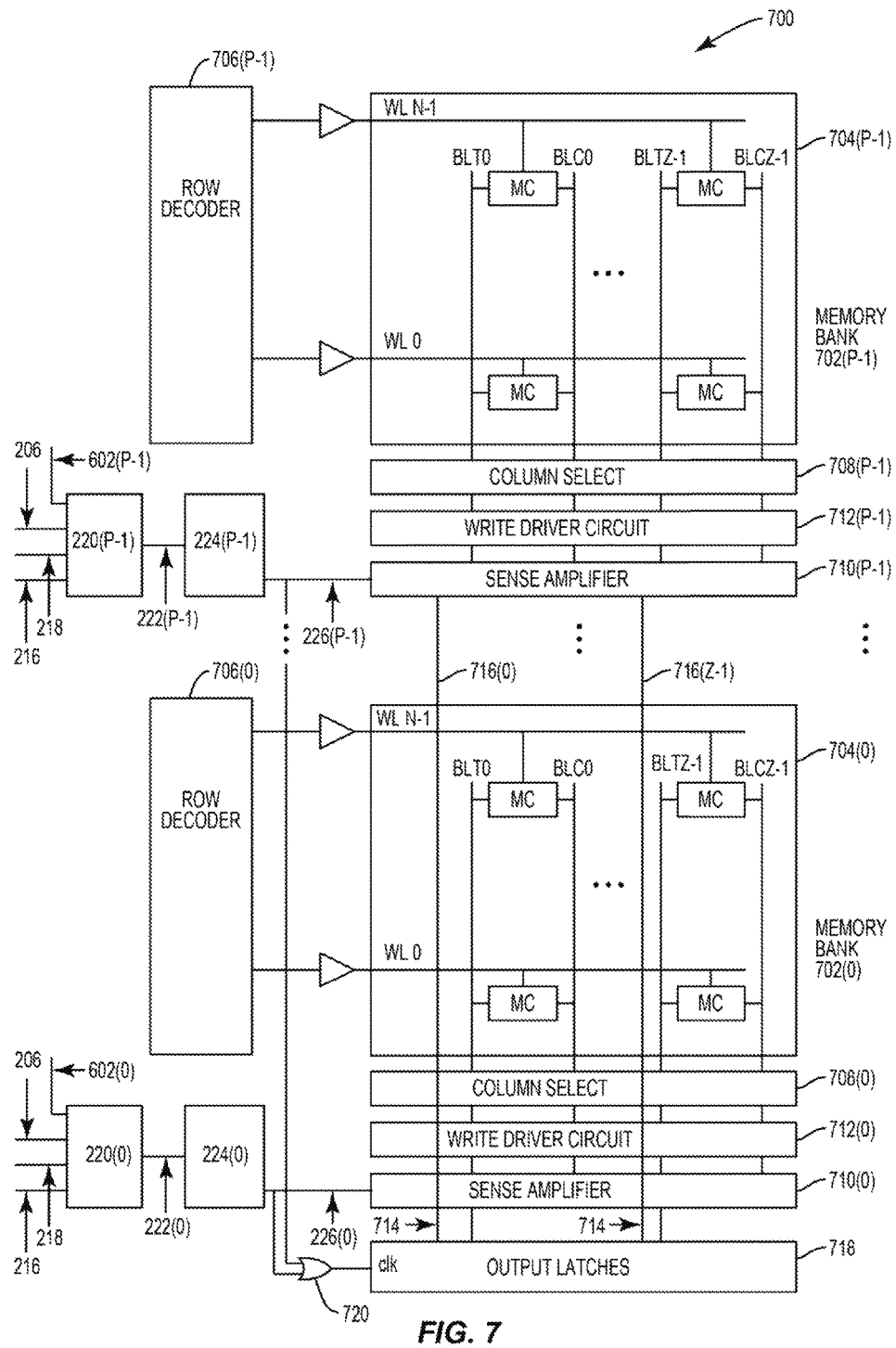
FIG. 7 is a diagram of an exemplary multiple bank N-way set associative cache memory employing multiple memory banks and the cache memory clock generation circuit of FIG. 6.

To provide clarification concerning how the cache memory clock generation circuit 600 of FIG. 6 fits into a cache memory system, FIG. 7 is a diagram of an exemplary N-way set associative cache memory system 700 employing memory banks 702(0)-702(P−1). Each memory bank 702(0)-702(P−1) employs a corresponding data array 704(0)-704(P−1) divided into an N number of ways. Although not shown, a tag comparator similar to the tag comparators 114(0)-114(N−1) of FIG. 1 is employed for each of the N ways in each memory bank 702(0)-702(P−1). Additionally, a row decoder 706(0)-706(P−1) and a column select 708(0)-708(P−1) corresponding to each memory bank 702(0)-702(P−1) select which memory cells (MC) in each corresponding data array 704(0)-704(P−1) are to be read by a corresponding sense amplifier 710(0)-710(P−1), or written to by a corresponding write driver circuit 712(0)-712(P−1). Further, each sense amplifier 710(0)-710(P−1) is clocked by a corresponding sense amplifier clock signal 226(0)-226(P−1) generated by the corresponding sense amplifier clock generation circuit 224(0)-224(P−1) of the cache memory clock generation circuit 600 of FIG. 6. Each sense amplifier 710(0)-710(P−1) is configured to provide sensed values 714 over global bit lines 716(0)-716(Z−1) to output latches 718 configured to store the sensed data resulting from a cache read access. An OR-based gate 720 is employed to receive each sense amplifier clock signal 226(0)-226(P−1) such that the output latches 718 are clocked similar to the sense amplifiers 710(0)-710(P−1) during a cache read access. In this manner, the cache memory clock generation circuit 600 can reduce power in the N-way set associative cache memory system 700 by enabling the corresponding sense amplifier 710(0)-710(P−1) and the output latches 718 in response to a hit in a single way, as opposed to a miss or an erroneous multiple way hit.

Further, the elements described herein are sometimes referred to as means for performing particular functions. In this regard, the detector circuit 202 is sometimes referred to herein as "a means for receiving a way address" and "a means for generating a one way hit signal in an active state in response to one bit of the plurality of bits of the way address being in an active state." The clock and enable circuit 208 is sometimes referred to herein as "a means for receiving a system clock signal, a cache enable signal, and a read enable signal" and "a means for generating a cache clock signal in response to the system clock signal and the cache enable signal each being in an active state." The clock and enable circuit 208 is also sometimes referred to herein as "a means for generating a cache read enable signal in an active state in response to the cache clock signal and the read enable signal each being in an active state." The gating circuit 220 is also sometimes referred to herein as "a means for generating a read clock signal in response to the one way hit signal, the cache clock signal, and the cache read enable signal each being in an active state." The sense amplifier clock generation circuit 224 is sometimes referred to herein as "a means for generating a sense amplifier clock signal in response to the read clock signal having a defined pulse width."

The cache memory clock generation circuits for reducing power consumption and read errors in cache memory according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
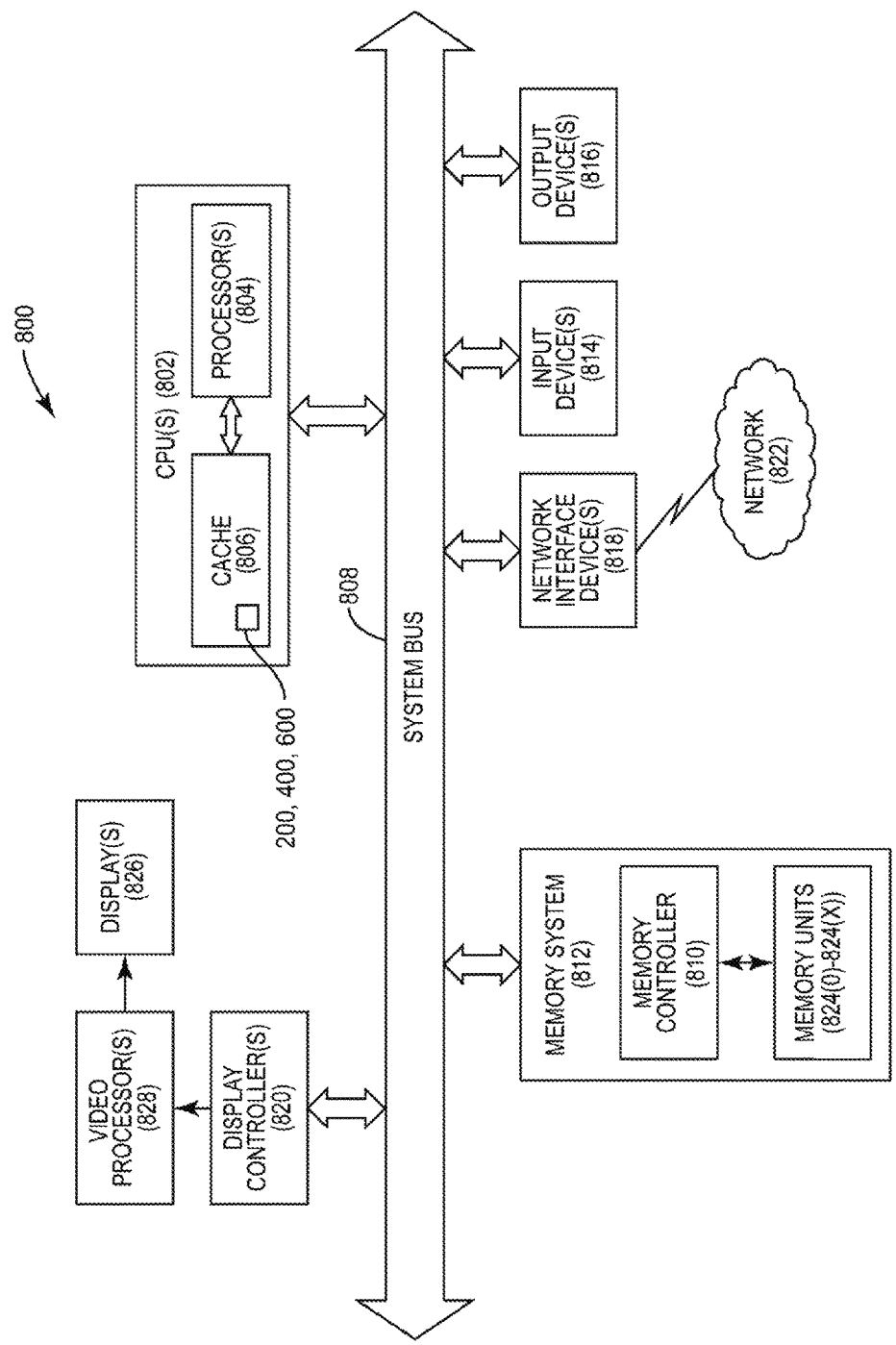
FIG. 8 is a block diagram of an exemplary processor-based system that can include the cache memory clock generation circuits of FIGS. 2, 4, and 6.

In this regard, FIG. 8 illustrates an example of a processor-based system 800 that can employ the cache memory clock generation circuits 200, 400, and 600 illustrated in FIGS. 2, 4, and 6, respectively. In this example, the processor-based system 800 includes one or more central processing units (CPUs) 802, each including one or more processors 804. The CPU(s) 802 may have cache memory 806 coupled to the processor(s) 804 for rapid access to temporarily stored data. The cache memory 806 can employ the cache memory clock generation circuits 200, 400, and 600 of FIGS. 2, 4, and 6, respectively. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any device configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(0)-824(X).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A cache memory clock generation circuit, comprising:
   a detector circuit configured to:
      receive a way address comprising a plurality of bits, wherein each bit of the plurality of bits corresponds to a way of a plurality of ways in a cache memory and indicates if a tag of a cache read request is present in the corresponding way; and
      generate a one way hit signal in an active state in response to one bit of the plurality of bits of the way address being in an active state;
   a clock and enable circuit configured to:
      receive a system clock signal, a cache enable signal, and a read enable signal;
      generate a cache clock signal in response to the system clock signal and the cache enable signal each being in an active state; and
      generate a cache read enable signal in an active state in response to the cache clock signal and the read enable signal each being in an active state;

a gating circuit configured to generate a read clock signal in response to the one way hit signal, the cache clock signal, and the cache read enable signal each being in an active state; and a sense amplifier clock generation circuit configured to generate a sense amplifier clock signal in response to the read clock signal having a defined pulse width.

2. The cache memory clock generation circuit of claim 1, wherein the detector circuit is further configured to generate the one way hit signal in an inactive state in response to each bit of the plurality of bits of the way address being in an inactive state.

3. The cache memory clock generation circuit of claim 2, wherein the detector circuit is further configured to generate the one way hit signal in an inactive state in response to more than one bit of the plurality of bits of the way address being in an active state.

4. The cache memory clock generation circuit of claim 1, wherein the clock and enable circuit comprises:
a clock generation circuit configured to:
receive the system clock signal and the cache enable signal; and
provide the cache clock signal; and
a flip-flop configured to:
receive the cache clock signal and the read enable signal; and
provide the cache read enable signal.

5. The cache memory clock generation circuit of claim 1, wherein the gating circuit comprises an AND-based logic gate configured to:
receive the one way hit signal, the cache clock signal, and the cache read enable signal; and
provide the read clock signal.

6. The cache memory clock generation circuit of claim 1, wherein the sense amplifier clock generation circuit is configured to generate the sense amplifier clock signal by being configured to:
receive the read clock signal;
generate a delayed read clock signal comprising the read clock signal delayed by a defined time period; and
generate the sense amplifier clock signal in response to the read clock signal and the delayed read clock signal being in an active state.

7. The cache memory clock generation circuit of claim 6, wherein the sense amplifier clock generation circuit comprises:
a delay circuit comprising an even number plurality of inverters, wherein:
the even number plurality of inverters are serially coupled;
a first inverter of the even number plurality of inverters is configured to receive the read clock signal; and
a final inverter of the even number plurality of inverters is configured to provide the delayed read clock signal; and
an AND-based logic gate configured to:
receive the read clock signal and the delayed read clock signal; and
provide the sense amplifier clock signal.

8. The cache memory clock generation circuit of claim 1 integrated into an integrated circuit (IC).

9. The cache memory clock generation circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

10. A cache memory clock generation circuit, comprising:
a means for receiving a way address comprising a plurality of bits, wherein each bit of the plurality of bits corresponds to a way of a plurality of ways in a cache memory and indicates if a tag of a cache read request is present in the corresponding way;
a means for generating a one way hit signal in an active state in response to one bit of the plurality of bits of the way address being in an active state;
a means for receiving a system clock signal, a cache enable signal, and a read enable signal;
a means for generating a cache clock signal in response to the system clock signal and the cache enable signal each being in an active state;
a means for generating a cache read enable signal in an active state in response to the cache clock signal and the read enable signal each being in an active state;
a means for generating a read clock signal in response to the one way hit signal, the cache clock signal, and the cache read enable signal each being in an active state; and
a means for generating a sense amplifier clock signal in response to the read clock signal having a defined pulse width.

11. The cache memory clock generation circuit of claim 10, further comprising a means for generating the one way hit signal in an inactive state in response to each bit of the plurality of bits of the way address being in an inactive state.

12. The cache memory clock generation circuit of claim 11, further comprising a means for generating the one way hit signal in an inactive state in response to more than one bit of the plurality of bits of the way address being in an active state.

13. The cache memory clock generation circuit of claim 10, wherein the means for generating the sense amplifier clock signal comprises:
a means for receiving the read clock signal;
a means for generating a delayed read clock signal comprising the read clock signal delayed by a defined time period; and
a means for providing the sense amplifier clock signal in response to the read clock signal and the delayed read clock signal being in an active state.

14. A method for clocking a cache memory to reduce power consumption and read errors, comprising:
receiving a way address comprising a plurality of bits, wherein each bit of the plurality of bits corresponds to a way of a plurality of ways in a cache memory and indicates if a tag of a cache read request is present in the corresponding way;
generating a one way hit signal in an active state in response to one bit of the plurality of bits of the way address being in an active state;
receiving a system clock signal, a cache enable signal, and a read enable signal;

generating a cache clock signal in response to the system clock signal and the cache enable signal each being in an active state;

generating a cache read enable signal in an active state in response to the cache clock signal and the read enable signal each being in an active state;

generating a read clock signal in response to the one way hit signal, the cache clock signal, and the cache read enable signal each being in an active state; and generating a sense amplifier clock signal in response to the read clock signal having a defined pulse width.

15. The method of claim 14, further comprising generating the one way hit signal in an inactive state in response to each bit of the plurality of bits of the way address being in an inactive state.

16. The method of claim 15, further comprising generating the one way hit signal in an inactive state in response to more than one bit of the plurality of bits of the way address being in an active state.

17. The method of claim 14, wherein generating the sense amplifier clock signal comprises:

receiving the read clock signal;

generating a delayed read clock signal comprising the read clock signal delayed by a defined time period; and generating the sense amplifier clock signal in response to the read clock signal and the delayed read clock signal being in an active state.

18. An N-way set associative cache memory system, comprising:

a plurality of memory banks, wherein each memory bank of the plurality of memory banks comprises:

a plurality of data arrays, wherein each data array of the plurality of data arrays corresponds to a way of a plurality of ways;

a plurality of tag comparators, wherein each tag comparator of the plurality of tag comparators corresponds to a way of the plurality of ways; and a sense amplifier configured to read data from a corresponding data array of the plurality of data arrays in response to a corresponding sense amplifier clock signal; and a cache memory clock generation circuit comprising:

a detector circuit configured to:

receive a way address comprising a plurality of bits, wherein each bit of the plurality of bits corresponds to a way of the plurality of ways and indicates if a tag of a cache read request is present in the corresponding way; and generate a one way hit signal in an active state in response to one bit of the plurality of bits of the way address being in an active state;

a clock and enable circuit configured to:

receive a system clock signal, a cache enable signal, and a read enable signal;

generate a cache clock signal in response to the system clock signal and the cache enable signal each being in an active state; and generate a cache read enable signal in an active state in response to the cache clock signal and the read enable signal each being in an active state;

a plurality of gating circuits, wherein each gating circuit is configured to generate a corresponding read clock signal in response to the one way hit signal, the cache clock signal, the cache read enable signal, and a corresponding bank enable signal each being in an active state; and a plurality of sense amplifier clock generation circuits, wherein each sense amplifier clock generation circuit is configured to generate the corresponding sense amplifier clock signal in response to the corresponding read clock signal having a defined pulse width; and a plurality of output latches configured to store the data sensed by the sense amplifier corresponding to each of the plurality of memory banks in response to the corresponding sense amplifier clock signal.

19. The N-way set associative cache memory system of claim 18, wherein the detector circuit of the cache memory clock generation circuit is further configured to generate the one way hit signal in an inactive state in response to each bit of the plurality of bits of the way address being in an inactive state.

20. The N-way set associative cache memory system of claim 19, wherein the detector circuit of the cache memory clock generation circuit is further configured to generate the one way hit signal in an inactive state in response to more than one bit of the plurality of bits of the way address being in an active state.

21. The N-way set associative cache memory system of claim 18, wherein each sense amplifier clock generation circuit of the plurality of sense amplifier clock generation circuits is configured to generate the corresponding sense amplifier clock signal by being configured to:

receive the corresponding read clock signal;

generate a delayed read clock signal comprising the corresponding read clock signal delayed by a defined time period; and generate the sense amplifier clock signal in response to the corresponding read clock signal and the delayed read clock signal being in an active state.

* * * * *